(12) United States Patent
Kotani

(10) Patent No.: US 6,727,553 B2
(45) Date of Patent: Apr. 27, 2004

(54) SEMICONDUCTOR DEVICE INCLUDING SOI SUBSTRATE

(75) Inventor: Naoki Kotani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/225,138

(22) Filed: Aug. 22, 2002

(65) Prior Publication Data

US 2003/0038323 A1 Feb. 27, 2003

(30) Foreign Application Priority Data

Aug. 27, 2001 (JP) ........................................ 2001-256548

(51) Int. Cl.[7] ........................ H01L 27/01; H01L 27/12; H01L 31/0392
(52) U.S. Cl. ........................ 257/351; 257/347; 257/354
(58) Field of Search ................................. 257/347, 351, 257/354, 507, 510, 513, 514, 515

(56) References Cited

U.S. PATENT DOCUMENTS

| | | | |
|---|---|---|---|
| 6,002,154 A | * | 12/1999 | Fujita .......................... 257/349 |
| 6,118,152 A | * | 9/2000 | Yamaguchi et al. ........ 257/347 |
| 6,121,659 A | * | 9/2000 | Christensen et al. ........ 257/347 |
| 6,121,661 A | * | 9/2000 | Assaderaghi et al. ....... 257/355 |
| 6,130,458 A | * | 10/2000 | Takagi et al. ................ 257/351 |
| 6,153,912 A | * | 11/2000 | Holst .......................... 257/347 |
| 6,180,985 B1 | * | 1/2001 | Yeo ............................. 257/354 |
| 6,437,405 B2 | * | 8/2002 | Kim ............................ 257/347 |

\* cited by examiner

*Primary Examiner*—Ngân V. Ngô
(74) *Attorney, Agent, or Firm*—Nixon Peabody LLP; Donald P. Studebaker

(57) ABSTRACT

After a Si layer (2) is formed on a BOX layer (1) of a semiconductor substrate (50), trenches (11) and (15) each reaching the semiconductor substrate (50) are formed. An electric connection is provided between the Si layer (2) and an external circuit by forming a sidewall (18) composed of a conductor material over the side surfaces of the trenches (11) and (15). This facilitates fixation of the body potential of the Si layer (2). Oxidation for rounding off the upper-surface edge portions of the Si layer (2) is further performed with the upper-surface edge portions of the Si layer (2) being exposed and with the lower-surface edge portions of the Si layer (2) being covered with the sidewall (18). As a consequence, the deformation of the lower-surface edge portions of the Si layer (2) resulting from oxidation is less likely to occur and a leakage current resulting from a failure caused by the deformation of the lower-surface edge portions of the Si layer (2) is suppressed.

10 Claims, 16 Drawing Sheets

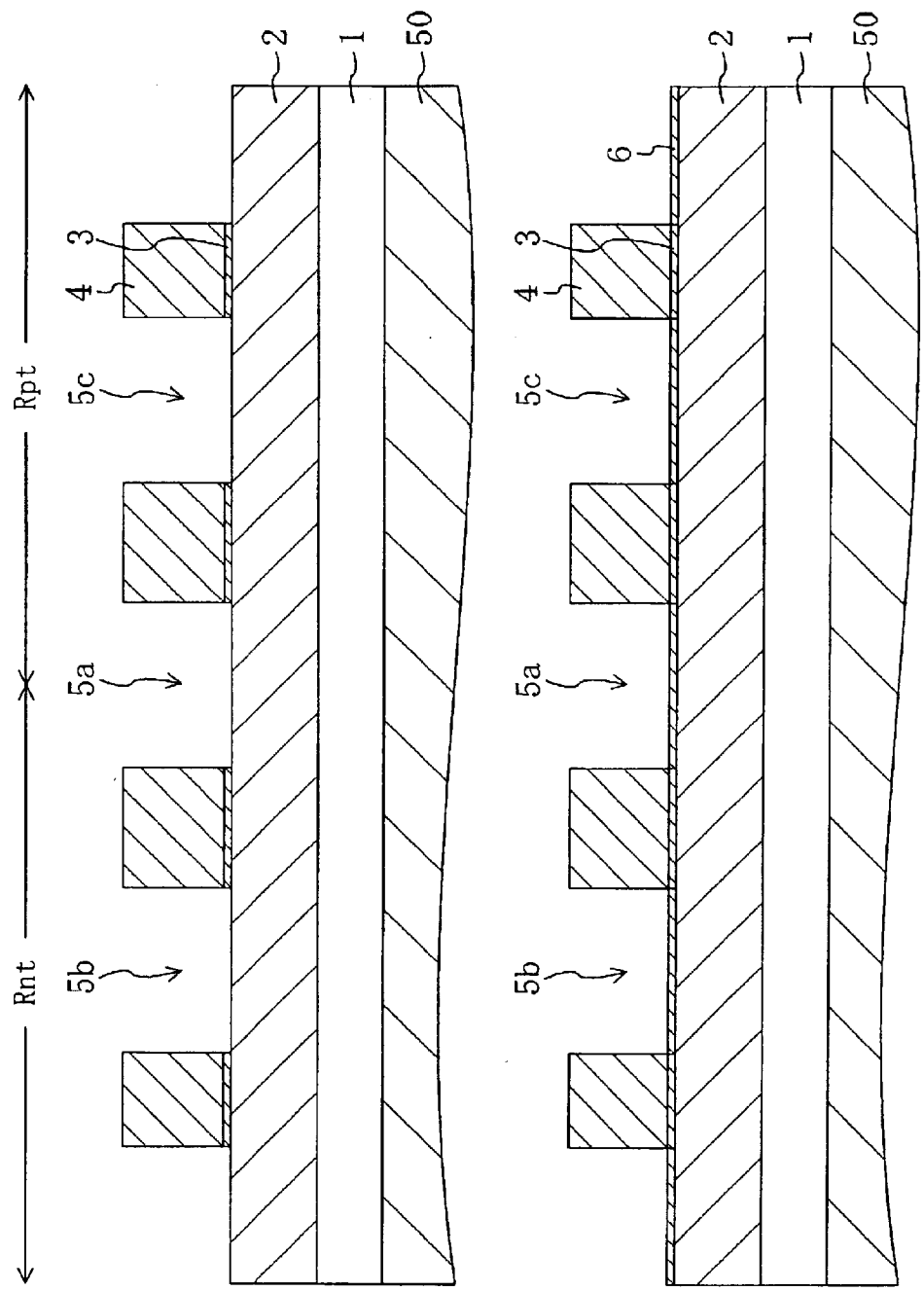

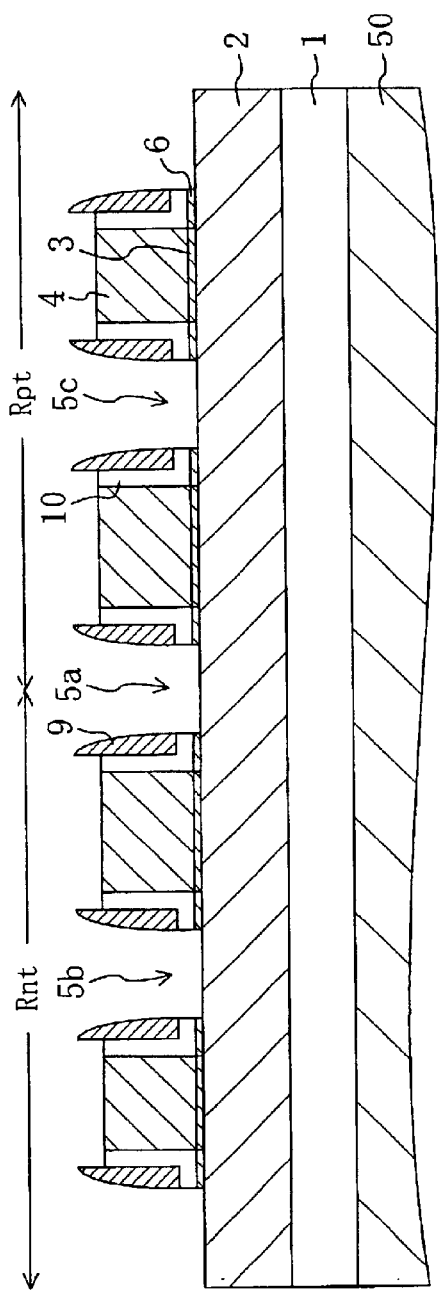
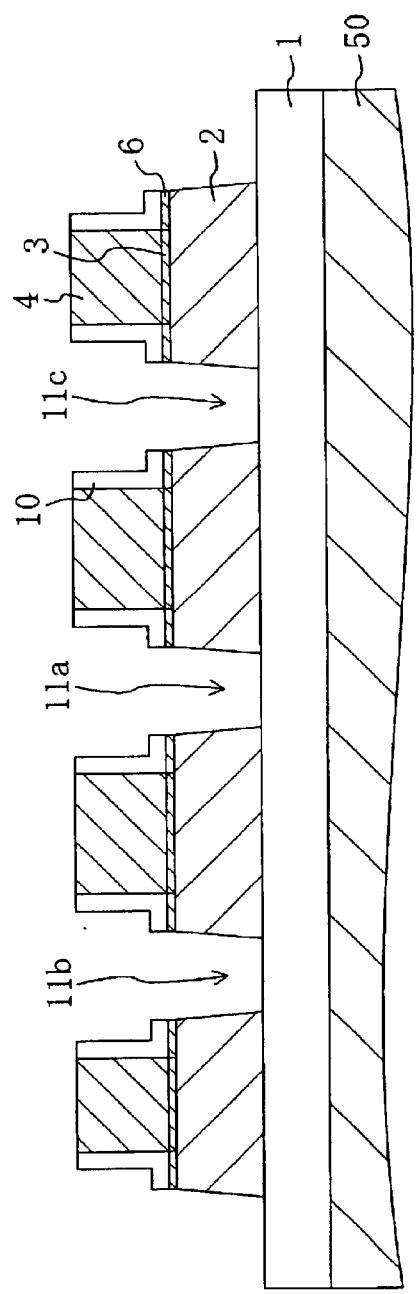
FIG. 3A
FIG. 3B

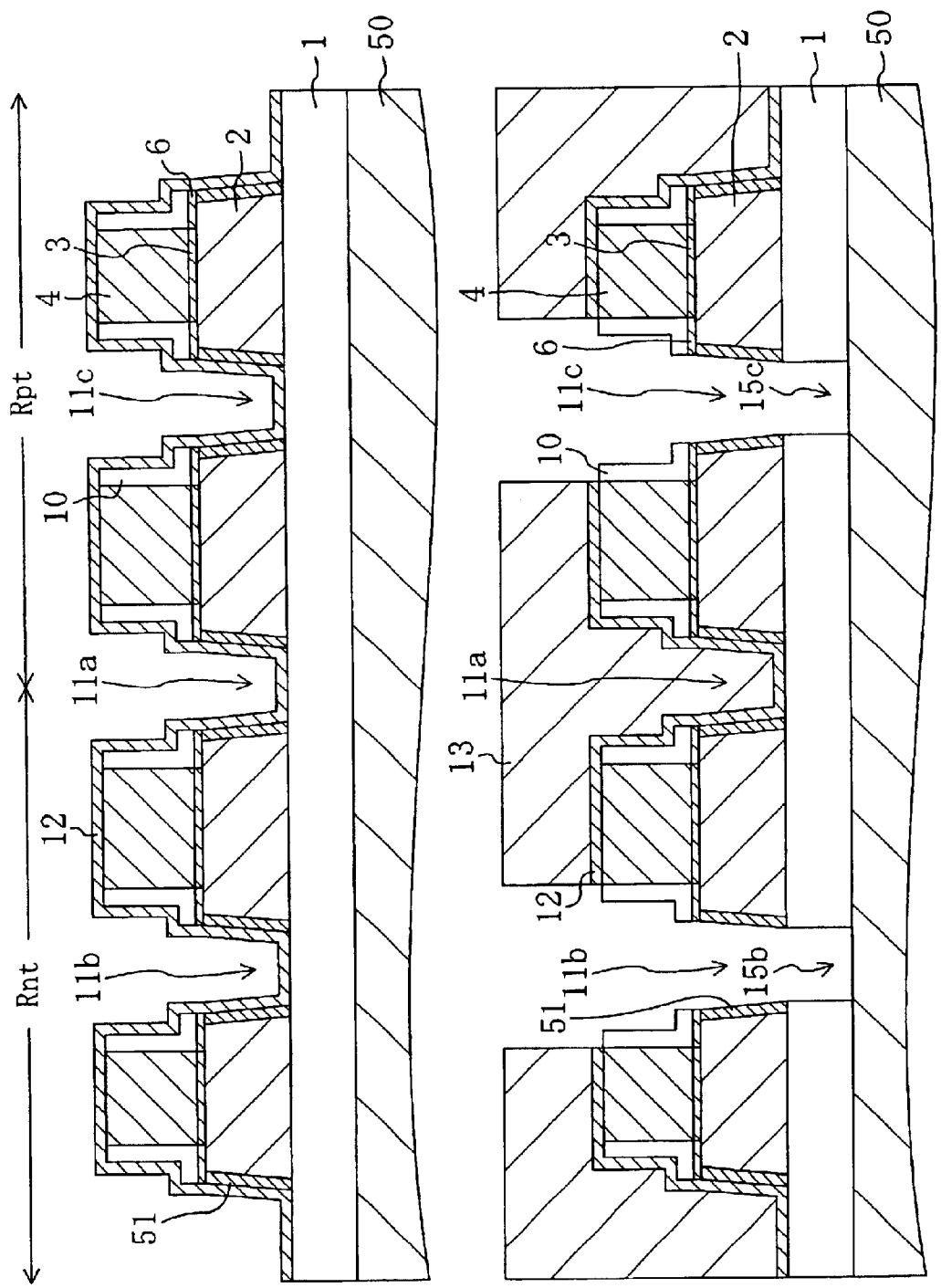

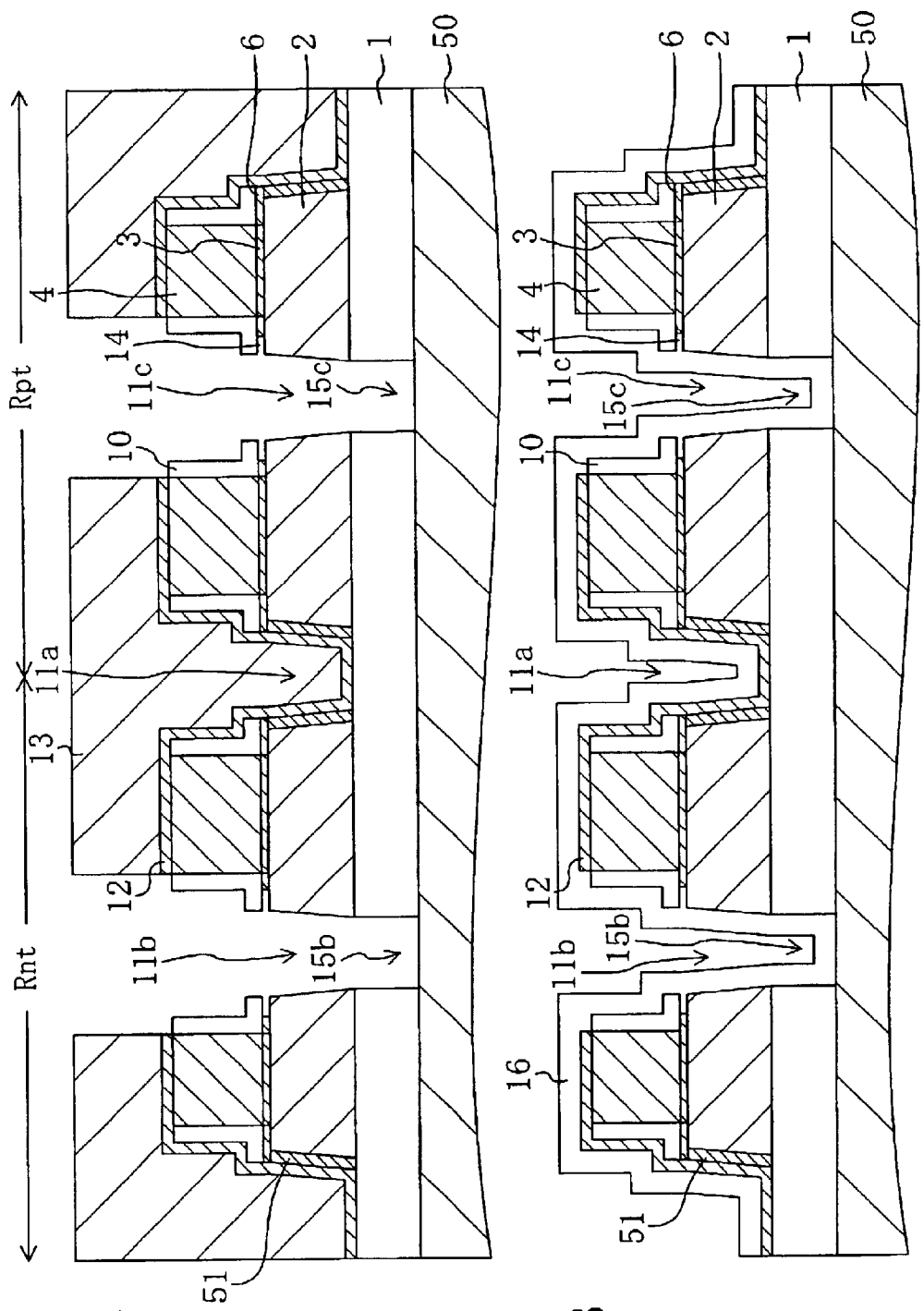

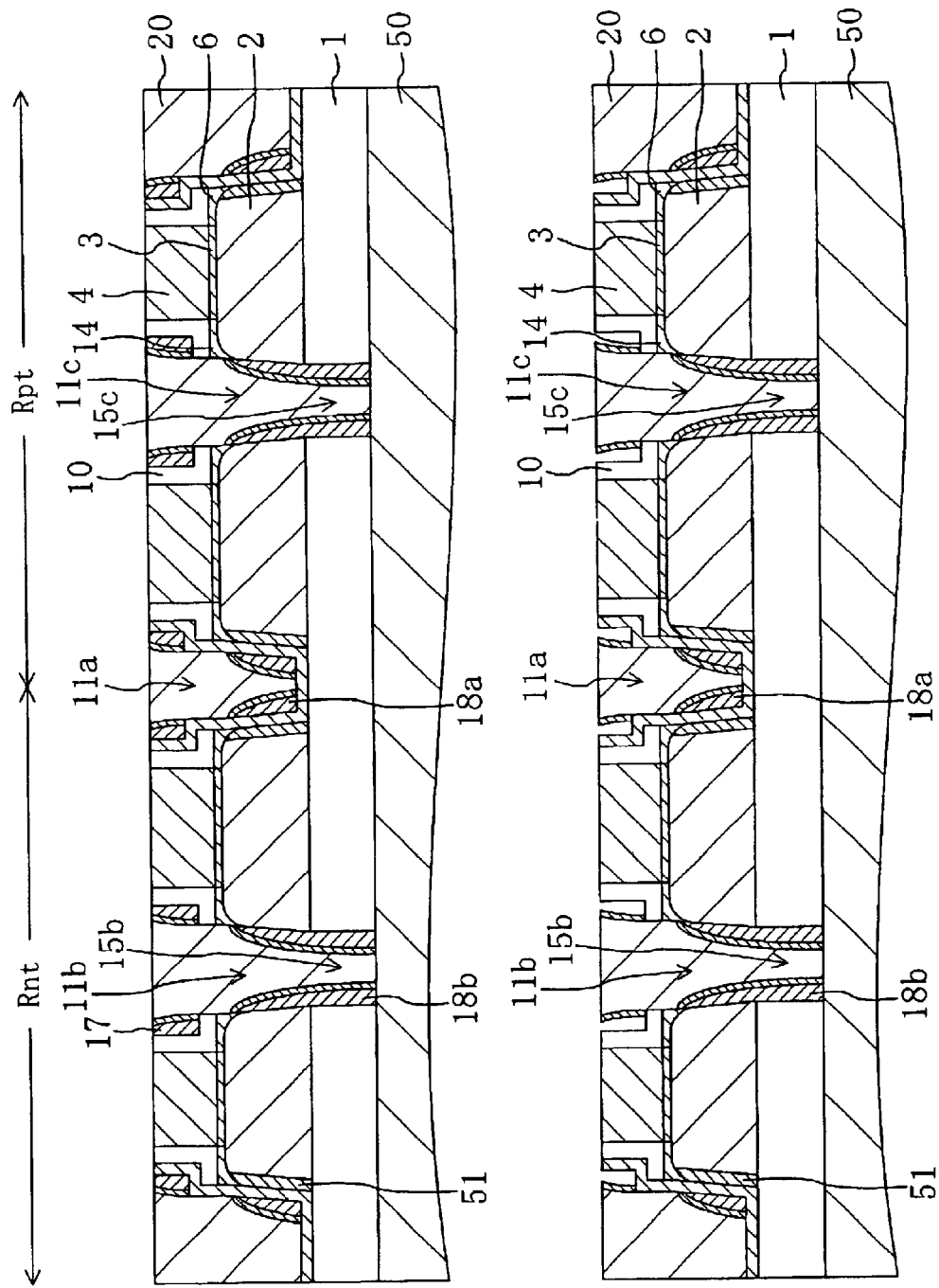

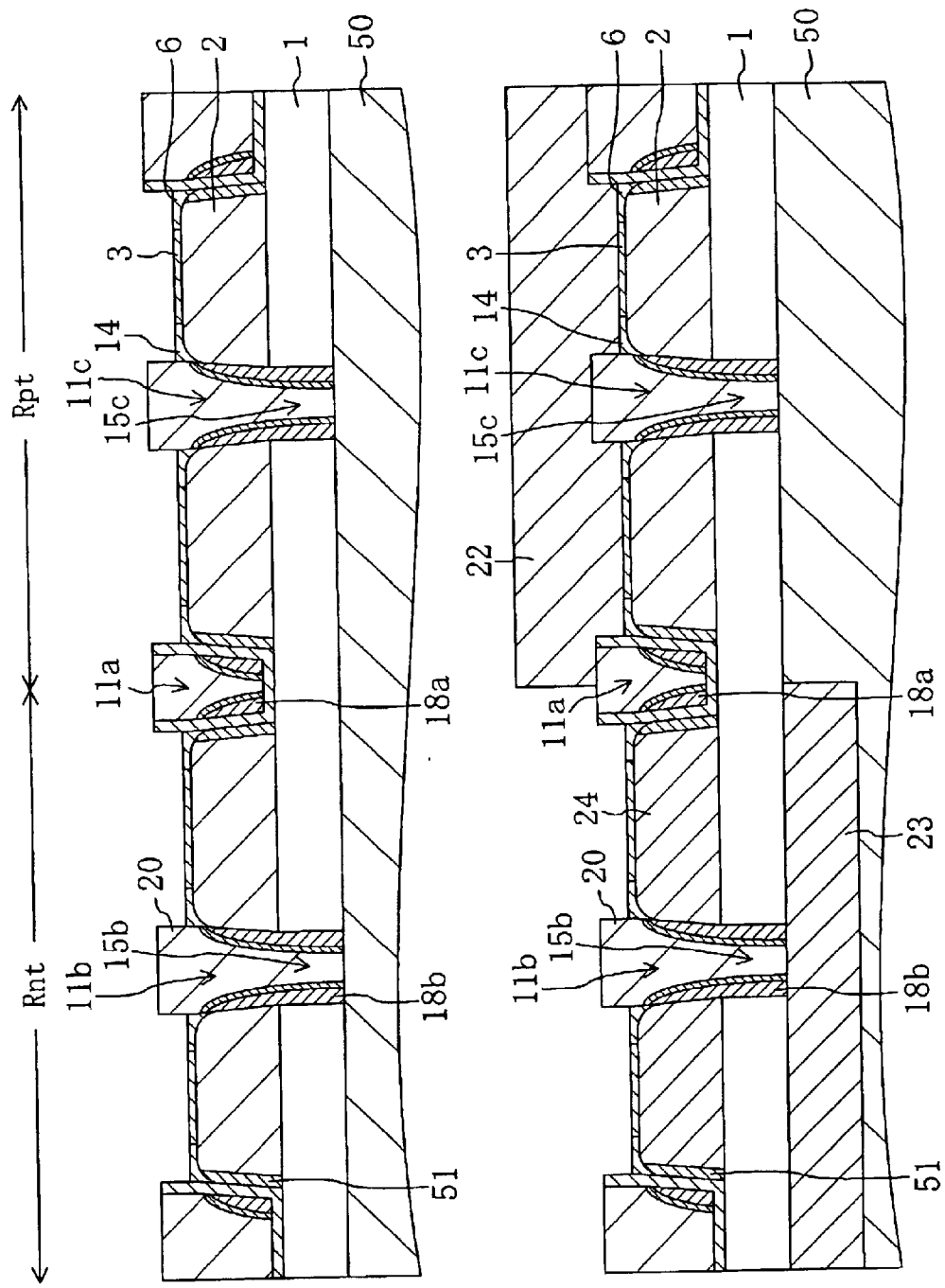

US 6,727,553 B2

SEMICONDUCTOR DEVICE INCLUDING SOI SUBSTRATE

BACKGROUND OF THE INVENTION

The present invention relates to a semiconductor device using a SOI substrate and to a method for fabricating the same.

In recent years, rapid miniaturization in the field of semiconductor devices has spurred the trends toward higher-speed operation and lower power consumption. However, conventional processes using bulk silicon wafers are approaching their limits in terms of achieving higher-speed operation and lower power consumption. On the other hand, there have been growing expectations for processes using silicon-on-insulator (hereinafter referred to as SOI) wafers as next-generation devices.

In a process using a SOI device, such as a MOS transistor, formed on a SOI wafer, emphasis has been placed on compatibility with a process using bulk silicon.

FIGS. 15A and 15B and FIGS. 16A and 16B are cross-sectional views illustrating the process steps of fabricating a conventional SOI device.

First, in the step shown in FIG. 15A, a buried oxide film layer (BOX layer) 101 is formed by a method of implanting oxygen ions into a region at a given depth from a surface of a semiconductor substrate 100 or the like. Then, a Si layer 102 is formed on the BOX layer 101. After an oxide film 103 and a silicon nitride film 104 are grown on the Si layer 102, the oxide film 103 and the silicon nitride film 104 are patterned by lithography and dry etching so that openings are formed in isolation regions 105.

Next, in the step shown in FIG. 15B, the Si layer 102 is patterned by dry etching by using the silicon nitride film 104 as a mask so that transistor regions 102a each composed of the Si layer are formed, while trenches 106 are formed simultaneously in the isolation regions 105.

Next, in the step shown in FIG. 16A, the side surfaces of the transistor region 102a are oxidized so that sidewall oxide films 107 are formed. At the same time as the formation of the sidewall oxide films 107, the edge portions of the upper surfaces of the transistor regions 102a are rounded off so that the localization of an electric field to the edge portions is suppressed.

Then, in the step shown in FIG. 16B, CVD oxide films are buried in the trenches 106 to form buried shallow trench isolations 110 (hereinafter referred to as STIs).

However, the conventional SOI device has the following problems.

Since the transistor regions 102a each composed of the Si layer are isolated electrically completely by the BOX layer 101 and the STIs 110 on the SOI wafer, the body potential of each of the transistor regions 102a is difficult to fix. To fix the body potential, therefore, the conventional SOI device requires a special pattern using a layout different from the layout of a bulk silicon device.

In addition, the lower-surface edge portions of the transistor regions 102a in contact with the BOX layer 101 are significantly oxidized when the sidewall oxide films 107 are formed in the step shown in FIG. 16A. At this time, the transistor regions 102a are oxidized not only by oxygen passing through the sidewall oxide films 107 being formed but also by oxygen passing through the BOX layer 101, so that abnormal oxide regions 109 are formed. This warps the lower-surface edge regions of the transistor regions 102a upward and deforms the substrate. Consequently, a failure occurs in the portion of the transistor regions 102a on which the stress of deformation is exerted and malfunction or a leakage current resulting from the failure may occur.

However, if an amount of oxidation is reduced for the suppression of abnormal oxidation of the lower-surface edge regions of the transistor regions 102a as described above, the upper-surface edge portions of the transistor regions 102a cannot be rounded off satisfactorily. This causes the localization of an electric field to the upper-surface edge portions. In the subsequent step, the problem of a reduction in threshold voltage may occur due to partial destruction of a gate oxide film.

SUMMARY OF THE INVENTION

It is therefore a first object of the present invention to provide a SOI device wherein a body potential can be fixed without using a special pattern and a method for fabricating the same.

A second object of the present invention is to provide a SOI device wherein the localization of an electric field is suppressed by oxidizing the upper-surface edge portions of a transistor region of a SOI substrate, while suppressing the oxidation of the lower-surface edge portions of the transistor region and thereby preventing the occurrence of a failure, and a method for fabricating the same.

A semiconductor device according to the present invention comprises: a substrate insulator layer provided on a semiconductor substrate; a plurality of semiconductor layers which are provided on the substrate insulator layer and formed with a semiconductor element; a trench laterally surrounding the semiconductor layers and having at least one portion thereof reaching the semiconductor substrate; and a sidewall composed of a conductor material, provided along side surfaces of the trench, and having at least one portion thereof extending from above a surface of the semiconductor layers via a surface of the substrate insulator layer to reach a surface of the semiconductor substrate.

In the arrangement, the sidewall extending from the semiconductor layers to the semiconductor substrate provides a connection between the semiconductor layers and an eternal circuit so that the body potential of the semiconductor element is fixed easily.

The semiconductor layers have a region to be formed with a first-conductivity-type transistor and a region to be formed with a second-conductivity-type transistor and a portion of the trench located between the region to be formed with a first-conductivity-type transistor and the region to be formed with a second-conductivity-type transistor is not reaching the semiconductor substrate. If an RF signal is used, the arrangement suppresses the occurrence of noise which is likely to occur when the respective active regions of the first-conductivity-type transistor and the second-conductivity-type transistor are in close proximity.

A top portion of the sidewall is at a level lower than the upper surface of the semiconductor layers. The arrangement allows supply of oxygen from above the upper-surface edge portions of the semiconductor layers when the upper-surface edge portions of the semiconductor layers are oxidized to be rounded off so that the edge portions are rounded off easily.

At least one portion of the substrate insulator layer having a specified thickness is interposed between the semiconductor substrate and a bottom surface of the portion of the trench located between the region to be formed with a first-conductivity-type transistor and the region to be formed with a second-conductivity-type transistor. The arrangement more positively suppresses noise which is likely to occur in the semiconductor deice when the respective active regions of the first-conductivity-type transistor and the second-conductivity-type transistor are in close proximity.

A bottom surface of the portion of the trench located between the region to be formed with a first-conductivity-type transistor and the region to be formed with a second-conductivity-type transistor may be at a level higher than a lower surface of the substrate insulator layer.

A method for fabricating a semiconductor device according to the present invention is a method for fabricating a semiconductor device using a substrate having a substrate insulator layer provided on a semiconductor substrate and a semiconductor layer for forming an active layer of a semiconductor element, the semiconductor layer being provided on the substrate insulator layer, the method comprising the steps of: (a) removing a portion of the semiconductor layer and a portion of the substrate insulator layer to form a trench laterally surrounding the semiconductor layer and having at least one portion thereof reaching the semiconductor substrate; and (b) forming, over side surfaces of the trench, a sidewall composed of a conductor material and having at least one portion thereof extending from above a surface of the semiconductor layer via a surface of the substrate insulator layer to reach a surface of the semiconductor substrate.

In accordance with the method, the trench extending from the semiconductor layer and reaching the semiconductor substrate is formed and the sidewall composed of the conductor material is formed over the side surfaces of the trench. In the resulting structure, the semiconductor layer can be connected to an external circuit by the sidewall and the semiconductor substrate. The arrangement allows the formation of a semiconductor device wherein a voltage across the semiconductor layer, i.e., the body potential of the semiconductor element can be fixed easily.

The method further comprises: (c) prior to the step (a), forming an insulator layer on a portion of the semiconductor layer with an underlying film interposed therebetween and an L-shaped sidewall over side surfaces of the insulator layer, wherein the step (a) includes performing etching using the insulator layer and the L-shaped sidewall as a mask to form at least one portion of the trench and etching away a portion of the underlying film located under a lower end portion of the L-shaped sidewall. This allows supply of oxygen from above the upper-surface edge portions of the semiconductor layer isolated by the trench when the upper-surface edge portions are oxidized to be rounded off and thereby allows easy oxidation.

Preferably, the semiconductor layer includes a region to be formed with a first-conductivity-type transistor as an element and a region to be formed with a second-conductivity-type transistor as an element and the step (a) includes forming the trench such that the trench extends through the semiconductor layer and the substrate insulator layer to reach the semiconductor substrate in a region located over a boundary between regions to be formed with transistors of the same conductivity type.

In the step (a), the semiconductor layer includes a region to be formed with a first-conductivity-type transistor as an element and a region to be formed with a second-conductivity-type transistor as an element and the trench is formed such that at least one portion of the substrate insulator layer having a specified thickness is left in a region located over a boundary between a region to be formed with a first-conductivity-type transistor and a region to be formed with a second-conductivity-type transistor. If an RF noise is used, the arrangement suppresses noise which is likely to occur when the respective active regions of the first-conductivity-type transistor and the second-conductivity-type transistor are in close proximity.

The step (b) includes forming the sidewall such that a top portion thereof is at a level lower than the upper surface of the semiconductor layer and the method further comprises the step of: after the step (b), rounding off an upper-surface edge portion of the semiconductor layer by oxidation. By supplying oxygen from above the upper-surface edge portion of the semiconductor layer, the edge portion can be rounded off easily by oxidation.

BRIEF DESCRIPTION OF THE DRAWINGS

FIGS. 1A and 1B are cross-sectional views illustrating the steps of forming trench isolation regions and the like in a process of fabricating a semiconductor device according to an embodiment of the present invention;

FIGS. 3A and 3B are cross-sectional views illustrating the steps of forming L-shaped sidewalls and the like in the process of fabricating the semiconductor device according to the embodiment;

FIGS. 4A and 4B are cross-sectional views illustrating the steps of forming trenches and the like in the process of fabricating the semiconductor device according to the embodiment;

FIGS. 5A and 5B are cross-sectional views illustrating the step of forming recessed portions for the easy oxidization of the upper-surface edge portions of a Si layer and the like in the process of fabricating the semiconductor device of the embodiment;

FIGS. 8A and 8B are cross-sectional views illustrating the steps of polishing the substrate by CMP in the process of fabricating the semiconductor device according to the embodiment;

FIGS. 9A and 9B are cross-sectional views illustrating the steps of forming an NMIS contact diffusion layer, threshold control layers, and the like in the process of fabricating the semiconductor device according to the embodiment;

DETAILED DESCRIPTION OF THE INVENTION

Embodiment

Figures 2A, 2B:
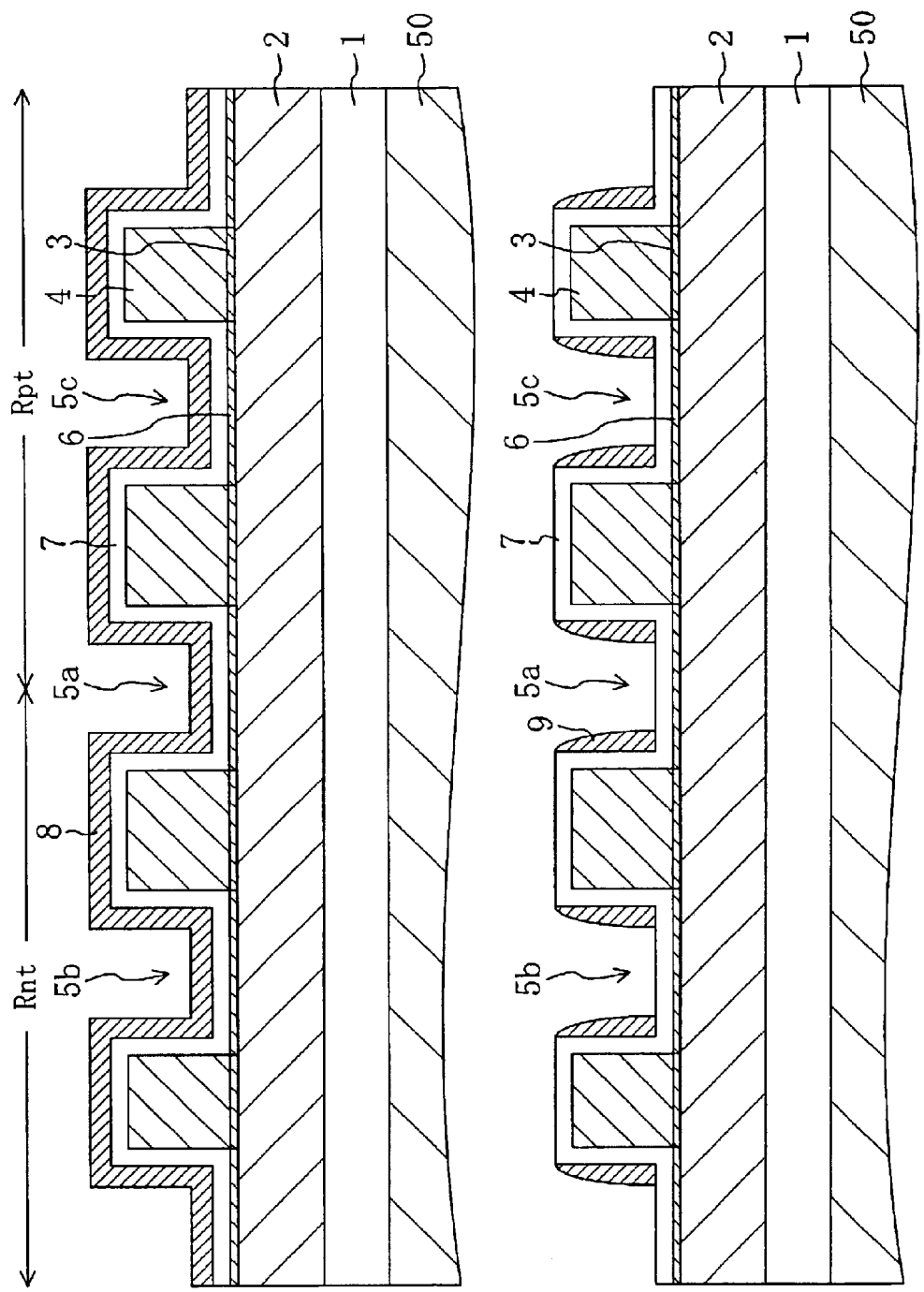
FIGS. 2A and 2B are cross-sectional views illustrating the steps till dummy sidewalls are formed in the process of fabricating the semiconductor device according to the embodiment.

Referring to FIGS. 1A to 14, a semiconductor device using a SOI substrate according to an embodiment of the present invention and a method for fabricating the same will be described.

FIGS. 1A to 13 are cross-sectional views illustrating the process steps of fabricating the SOI device according to the embodiment. FIG. 14 is a plan view showing a structure of the SOI device according to the present embodiment.

First, in the step shown in FIG. 1A, a BOX layer 1 with a thickness of 150 nm is formed in accordance with a method of implanting oxygen ions in a region at a given depth from a surface of a semiconductor substrate 50 or the like and a Si layer 2 with a thickness of 180 nm is left on the BOX layer 1. Then, a thermal oxide film with a thickness of 10 nm is formed on the Si layer 2 and a silicon nitride film with a thickness of 180 nm is formed by CVD on the thermal oxide film. Each of the semiconductor substrate 50, the BOX layer 1, and the Si layer 2 is partitioned into an NMIS formation region Rnt for forming N-channel transistors and a PMIS formation region Rpt for forming P-channel transistors. Thereafter, the thermal oxide film and the silicon nitride film are patterned by lithography and dry etching to form thermal oxide films 3 and a mask 4 for forming active regions, while the portions of the Si layer 2 located in the isolation region have surfaces temporarily exposed.

The isolation regions can be subdivided into: an NMIS-PMIS isolation region 5a for providing isolation between the N-channel and P-channel transistors from each other; an NMIS isolation region 5b for providing isolation between the N-channel transistors; and a PMIS isolation region 5c for providing isolation between the P-channel transistors. A material composing the Si layer 2 is not limited to single-crystal Si. Another semiconductor material such as SiGe or SiGeC may also be used instead. A material composing the mask 4 for forming active regions is not limited to a silicon nitride. Another material that can be etched selectively from the material composing the Si layer 2 may also be used instead.

Next, in the step shown in FIG. 1B, the upper surface of the Si layer 2 exposed in the NMIS-PMIS isolation region 5a, in the NMIS isolation region 5b, and in the PMIS isolation region 5c is oxidized to form a thermal oxide film 6. Consequently, the thermal oxide films 3 and 6 are joined to each other so that the upper surface of the Si layer 2 is covered entirely with the oxide film.

In the step shown in FIG. 2A, a silicon nitride film 7 with a thickness of 20 nm is formed on the substrate. Subsequently, an amorphous silicon film 8 with a thickness of 30 nm is formed. Instead of the silicon nitride film 7 and the amorphous silicon film 8, films composed of materials other than the silicon nitride and amorphous silicon that can be etched selectively from each other may also be used.

Next, in the step shown in FIG. 2B, the amorphous silicon film 8 is etched by anisotropic dry etching to form dummy sidewalls 9 each composed of amorphous silicon over the side surfaces of the mask 4 for forming active regions with the silicon nitride film 7 being interposed therebetween.

Next, in the step shown in FIG. 3A, the respective portions of the silicon nitride film 7 and the thermal oxide film 6 exposed on the substrate are etched by dry etching by using the dummy sidewalls 9 as a mask such that the surfaces of the portions of the Si layer 2 located in the NMIS isolation region 5b, in the PMIS isolation region 5c, and in the NMIS-PMIS isolation region 5a are exposed, while the upper surface of the mask 4 for forming active regions is also exposed. At this time, the portions of the silicon nitride film 7 located in the individual isolation regions 5a to 5c and over the mask 4 for forming active regions are etched away, while the portions of the silicon nitride film 7 covered with the dummy sidewalls 9 remain to form L-shaped sidewalls 10 composed of the silicon nitride film which are interposed between the dummy sidewalls 9 and the mask 4 for forming active regions.

Next, in the step shown in FIG. 3B, the regions of the Si layer 2 located in the NMIS-PMIS isolation region 5a, in the NMIS isolation region 5b, and in the PMIS isolation region 5c are etched away by using the mask 4 for forming active regions and the L-shaped sidewalls 10 as a mask so that an NMIS-PMIS trench 11a, an NMIS trench 11b, and a PMIS trench 11c are formed over the BOX layer 1. In this state, the BOX layer 1 is partly exposed at the respective bottom portions of the trenches 11a to 11c. At this time, the dummy sidewall 9 is also removed simultaneously with the etching of the Si layer 2.

Next, in the step shown in FIG. 4A, the side surfaces of the Si layer 2 are oxidized such that sidewall oxide films 51 each with a thickness of about 5 nm are formed to be exposed in the NMIS trench 11b, in the PMIS trench 11c, and in the NMIS-PMIS trench 11a. Subsequently, a TEOS film 12 with a thickness of 20 nm is formed on the substrate.

In accordance with the conventional fabrication method, it is necessary to round off the upper-surface edge portions of the Si layer by oxidation at the same time as the sidewall oxide films are formed by oxidizing the side surfaces of the Si layer opposing the individual trenches. To round off the upper-surface edge portions of the Si layer, however, oxidation should be performed such that the thickness of each of the sidewall oxide films is 25 nm or more. Consequently, the oxidation of the lower-surface edge portions of the Si layer is likely to proceed and the Si layer may warp to be deformed. If the Si layer is deformed, a failure is likely to occur in the portion to which stress is applied.

According to the present embodiment, by contrast, the upper-surface edge portions of the Si layer 2 need not be rounded off when the sidewall oxide films 51 are formed in the step shown in FIG. 4A. Therefore, it is no more necessary to form the sidewall oxide films 51 thick and the thickness of each of the sidewall oxide films 51 can be reduced so that the lower-surface edge portions of the Si layer 2 are more resistant to oxidation. This suppresses the occurrence of a failure resulting from significant deformation of the Si layer 2 and thereby circumvents the occurrence of a leakage current resulting from the failure.

Next, in the step shown in FIG. 4B, a first resist mask 13 having respective openings over the NMIS trench 11b and the PMIS trench 11c is formed on the substrate by lithography. Then, dry etching is performed by using the first resist mask 13 as a mask, thereby forming an NMISBOX trench 15b and a PMIBOX trench 15c each reaching the semiconductor substrate 50. At the same time, the respective portions of the TEOS film 12 and the BOX layer 1 corresponding to the opening regions of the first resist mask 13 are etched away.

Thus, the respective portions of the BOX layer 1 located under the NMIS trench 11b and the PMIS trench 11c are removed so that the NMISBOX trench 15b and the PMIX-BOX trench 15c extending through the Si layer 2 and the BOX layer 1 are formed. It is to be noted that conductor sidewalls will be formed over the side surfaces of the NMISBOX trench 15b and the PMIXBOX trench 15c in the subsequent step. Consequently, the portions of the Si layer 2 located in the NMIS formation region Rnt and in the PMIS formation region Rpt are connected electrically to the semiconductor substrate 50 via the conductor sidewalls, which allows an electrical connection with an external circuit. Such a structure facilitates fixation of the body potential.

On the other hand, the NMIS-PMIS trench 11a is covered in protected relation with the first resist mask 13 during dry etching. Accordingly, the portion of the BOX layer 1 located under the NMIS-PMIS trench 11a is not removed.

Next, in the step shown in FIG. 5A, the portions of the sidewall oxide films 51 exposed in the NMISBOX trench 15b and the PMISBOX trench 15c, each of which has an open upper end, are removed by wet etching. At the same time, the portions of the thermal oxide film 6 facing the NMISBOX trench 15b and the PMISBOX trench 15c are removed by wet etching so that recessed portions 14 are formed between the L-shaped sidewalls 10 and the Si layer 2.

Next, in the step shown in FIG. 5B, the first resist mask 13 is removed and then an amorphous silicon film 16 with a thickness of 50 nm is formed on the substrate. At this time, the recessed portions 14 are filled with amorphous silicon. Instead of the amorphous silicon film 16, there may also be formed a film composed of another amorphous semiconductor material such as an amorphous SiGe film or an amorphous SiGeC film, a film composed of a polycrystalline semiconductor material such as a polysilicon film, a SiGe polycrystalline film, or an SiGeC polycrystalline film, or a film composed of a conductor material such as metal.

Figure 6A:
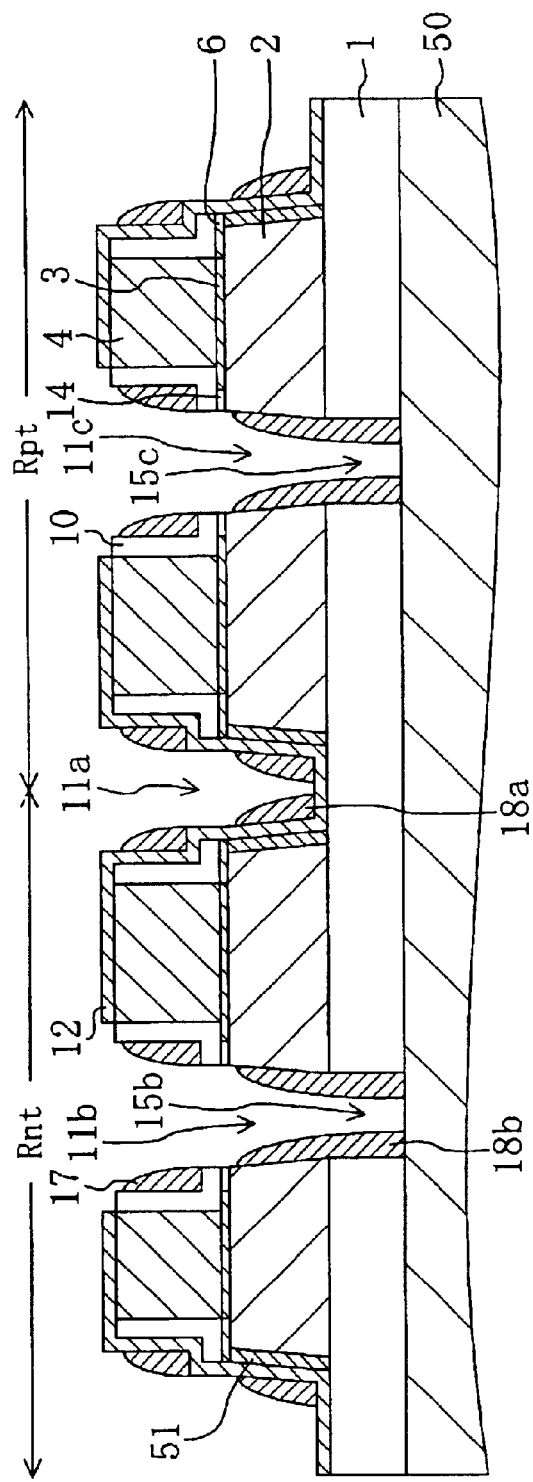
FIGS. 6A and 6B are cross-sectional views illustrating the steps of forming sidewalls in the trenches in the process of fabricating the semiconductor device according to the embodiment.

Next, in the step shown in FIG. 6A, the amorphous silicon film 16 is etched by anisotropic etching so that first sidewalls 17 are formed on the L-shaped sidewalls 10 located over the side surfaces of the mask 4 for forming active regions and the TEOS film 12. In the NMIS-PMIS trench 11a, a second sidewall 18a is formed over the side surfaces of the Si layer 2 and on the upper surface of the BOX layer 1 with the TEOS film 12 interposed therebetween.

In each of the NMISBOX trench 15b and the PMISBOX trench 15c, on the other hand, third sidewalls 18b are formed directly over the respective side surfaces of the Si layer 2 and the BOX layer 1 and on the upper surface of the semiconductor substrate 50. Since the side surfaces of the mask 4 for forming active regions have stepped portions due to the L-shaped sidewalls 10, isolation can be provided between the first and second sidewalls 17 and 18a and between the first and third sidewalls 17 and 18b by performing etching for a long period of time.

Since amorphous silicon covering the side surfaces of the recessed portions 14 is removed by etching except for the portions thereof filling the recessed portions 14, the filling portions are exposed. In other words, the top portions of the third sidewalls 18b are positioned at a level lower than the second thermal oxide film 6. Likewise, the top portion of the second sidewall 18a is also positioned at a level lower than the second thermal oxide film 6.

Figure 6B:
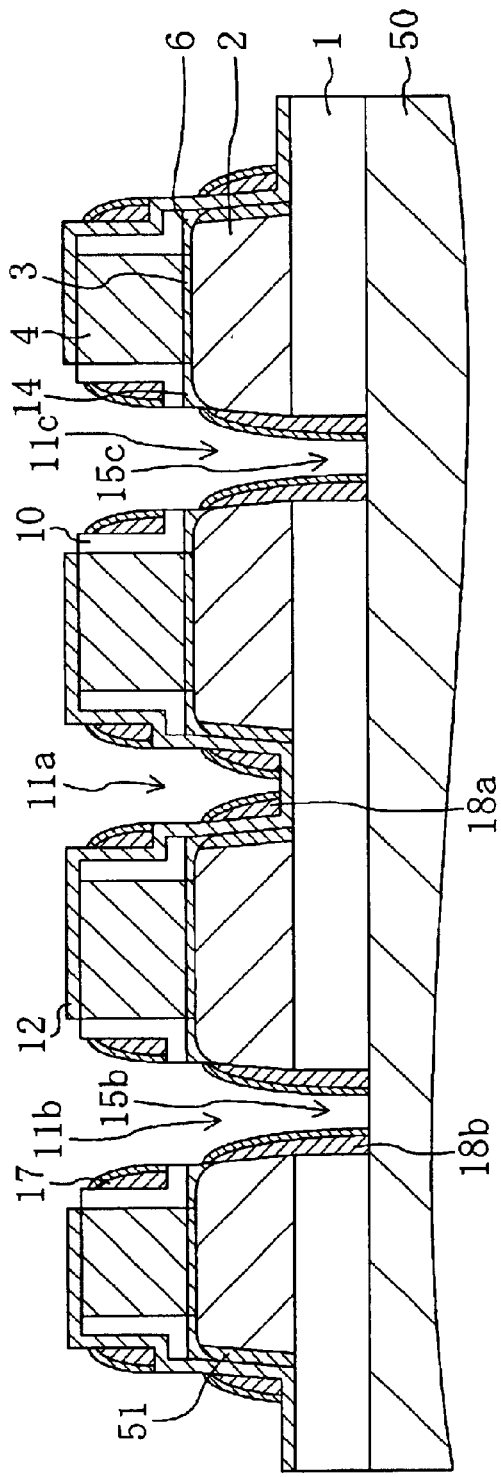

Next, in the step shown in FIG. 6B, the upper surface of the substrate is oxidized to form an oxide film with a thickness of about 25 nm on the exposed surface. Of the upper-surface edge portions of the Si layer 2, those opposing the NMIS-PMIS trench 11a is in a state prone to oxidation since the side surfaces thereof are covered only with the TEOS film 12 which easily permeates oxygen. Of the upper-surface edge portions of the Si layer 2, those opposing the NMISBOX trench 15b and the PMISBOX trench 15c are in a state particularly prone to oxidation since they are in contact with amorphous silicon filling the recessed portions 14 or exposed. By supplying oxygen to the upper-edge portions of the Si layer 2, the edge portions can sufficiently be rounded off by oxidation. At the same time, amorphous silicon filling the recessed portions 14 is also oxidized to form an oxide film. Simultaneously, the first, second, and third sidewalls 17, 18a, and 18b also have exposed surfaces oxidized.

In the step of oxidizing the upper-surface edge portions of the Si layer in accordance with the conventional fabrication method, the lower-surface edge portions of the Si layer are merely covered with the sidewall oxide film so that they are in a state prone to oxidation. If an oxide film with a thickness of 25 nm is formed to round off the upper-surface edge portions of the Si layer, therefore, the lower-surface edge portions of the Si layer are also oxidized significantly so that the Si layer is deformed.

In the present embodiment, by contrast, the upper-surface edge portions of the Si layer 2 are in a state prone to oxidation. On the other hand, the lower-surface edge portions of the Si layer 2 are in a state resistant to oxidation since they are covered with the second and third sidewalls 18a and 18b. Even if oxidation is performed to form an oxide film having a given thickness or more such that the upper-surface edge portions of the Si layer 2 are rounded off, the lower-surface edge portions of the Si layer 2 are no more oxidized significantly. As a result, the occurrence of a leakage current resulting from a failure caused by significant deformation can be suppressed.

Figure 7:
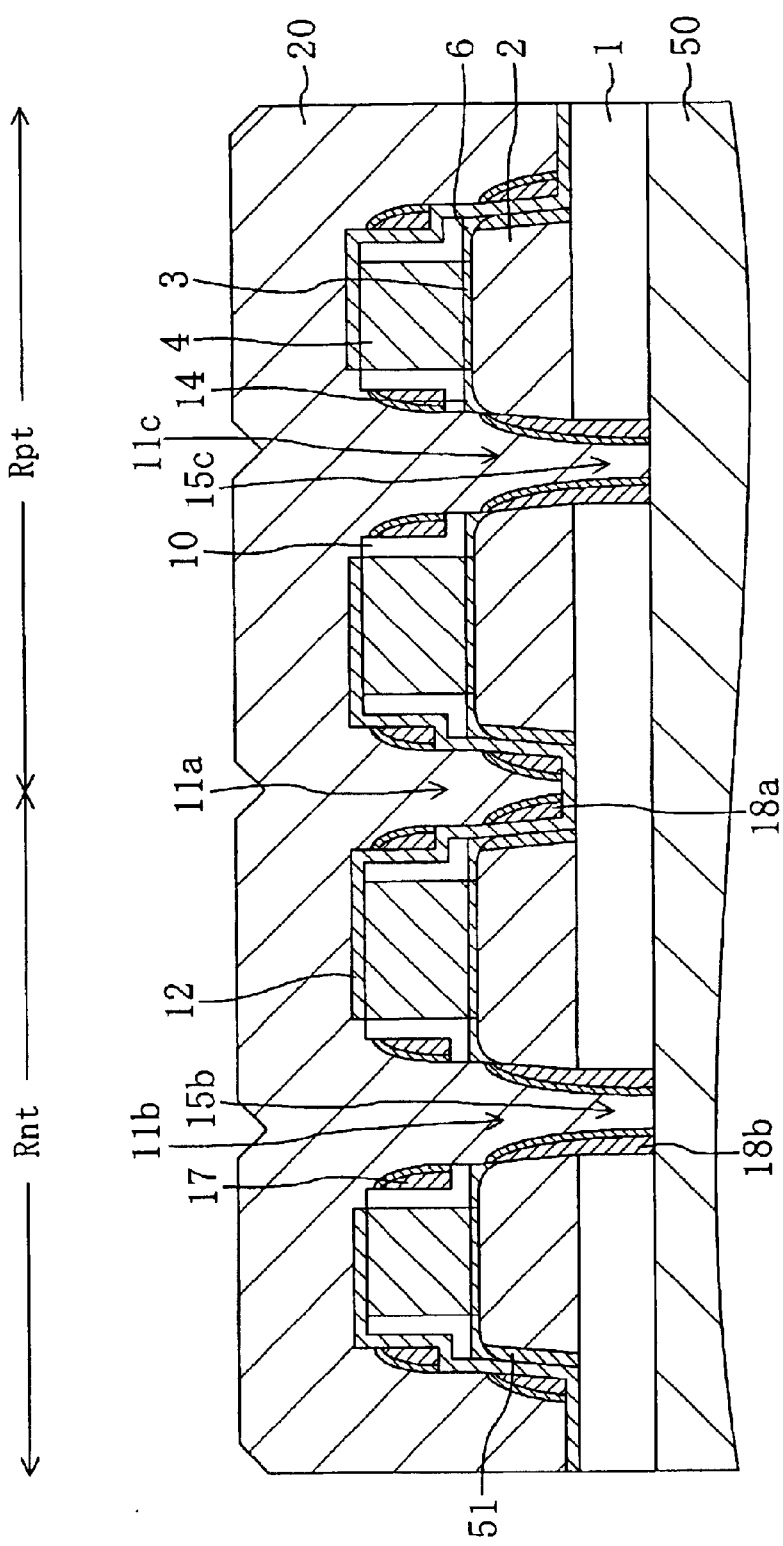
FIG. 7 is a cross-sectional view illustrating the step of forming a plasma CVD film on a substrate in the process of fabricating the semiconductor device according to the embodiment.

Next, in the step shown in FIG. 7, an oxide film with a thickness of 450 nm is deposited by plasma CVD on the substrate to form a plasma CVD oxide film 20 filling each of the trenches 11a to 11c and the BOX trenches 15b and 15c.

Next, in the step shown in FIG. 8A, the plasma CVD oxide film 20 and the TEOS film 12 on the substrate are polished by CMP till the mask 4 for forming active regions, the L-shaped sidewalls 10, and the first sidewalls 17 are exposed at the surface.

Next, in the step shown in FIG. 8B, the first sidewall 17 having an upper surface exposed at the substrate is removed by wet etching.

Next, in the step shown in FIG. 9A, the mask 4 for forming active regions, the L-shaped sidewalls 10, and a part of the TEOS film 12 each having an upper surface exposed at the substrate are removed by a process using a boiling phosphoric acid.

Next, in the step shown in FIG. 9B, a third resist mask 22 having an opening corresponding to the NMIS formation region Rnt is formed by lithography. Then, boron ions, e.g., are implanted at a dose of $9.0 \times 10^{13}$ atoms/cm$^2$ with an acceleration energy of 150 KeV so that an NMIS contact diffusion layer 23 is formed. Subsequently, boron ions, e.g., are implanted at a dose of $5.5 \times 10^{12}$ atoms/cm$^2$ with an acceleration energy of 30 KeV so that NMIS threshold control layers 24 are formed.

Figures 10A, 10B:
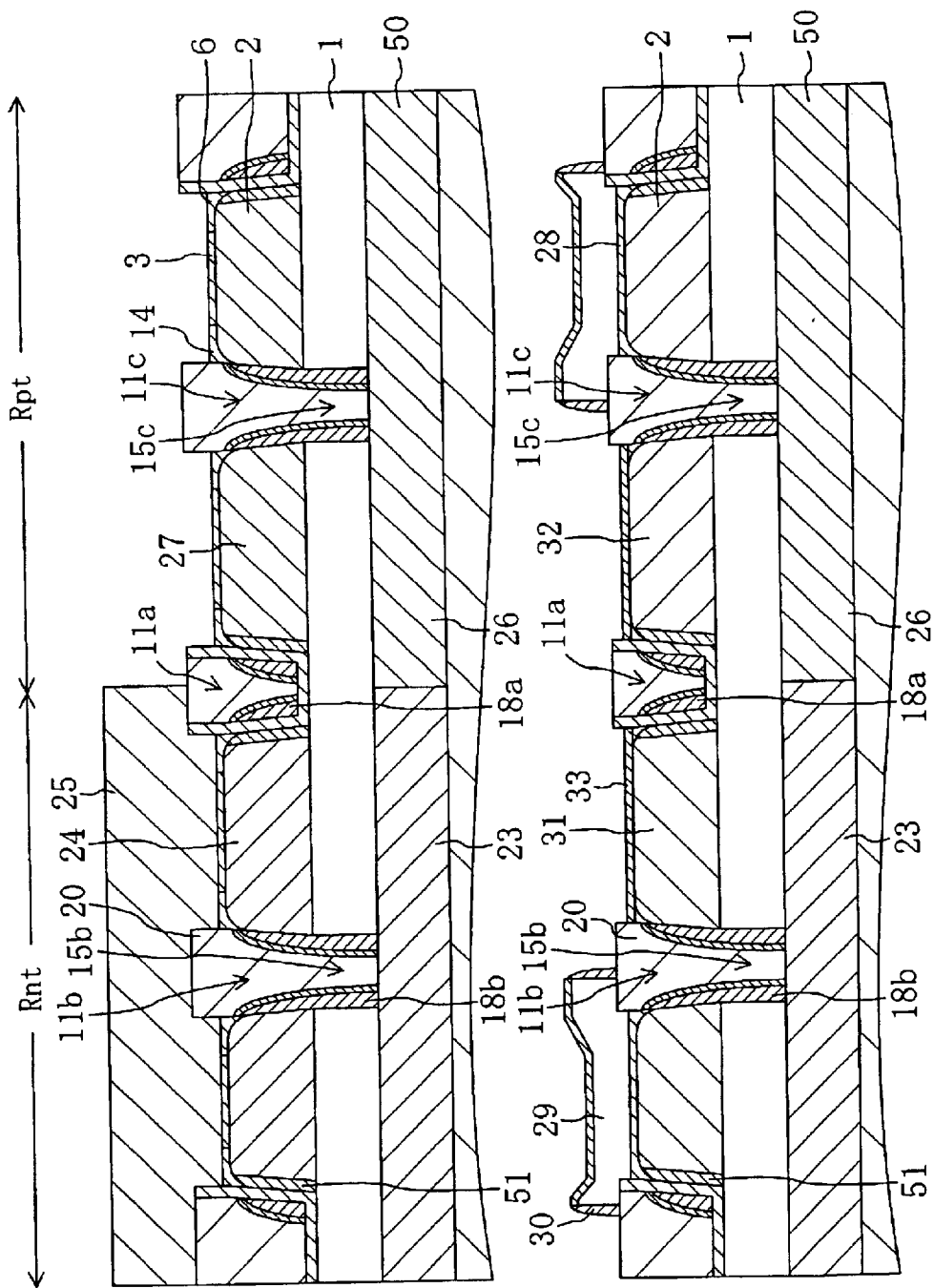
FIGS. 10A and 10B are cross-sectional views illustrating the steps of forming a PMIS contact diffusion layer, threshold control layers, and gate electrodes in the process of fabricating the semiconductor device according to the embodiment.

Next, in the step shown in FIG. 10A, the third resist mask 22 is removed. Then, a fourth resist mask 25 having an opening corresponding to the PMIS formation region Rpt is formed by lithography. By using the fourth resist mask 25 as a mask, phosphorus ions, e.g., are implanted in the region of the semiconductor substrate 50 located under the BOX film 1 at a dose of $9.0 \times 10^{13}$ atoms/cm$^2$ with an acceleration energy of 330 KeV so that a PMIS contact diffusion layer 26 is formed. Subsequently, phosphorus ions, e.g., are implanted into the region of the Si layer 2 located in the PMIS formation region Rpt at a dose of $1.2 \times 10^{12}$ atoms/cm$^2$ with an acceleration energy of 50 KeV so that a PMIS threshold control layer 27 is formed. Thereafter, the fourth resist mask 25 is removed.

Next, in the step shown in FIG. 10B, the portions of the thermal oxide films 3, the thermal oxide film 6, and the portion of the Si layer 2 oxidized in the step shown in FIG. 6B are removed by wet etching. Then, the gate oxide film 28 and the gate electrode 29 are formed by the same method as the conventional fabrication method.

Figure 13:
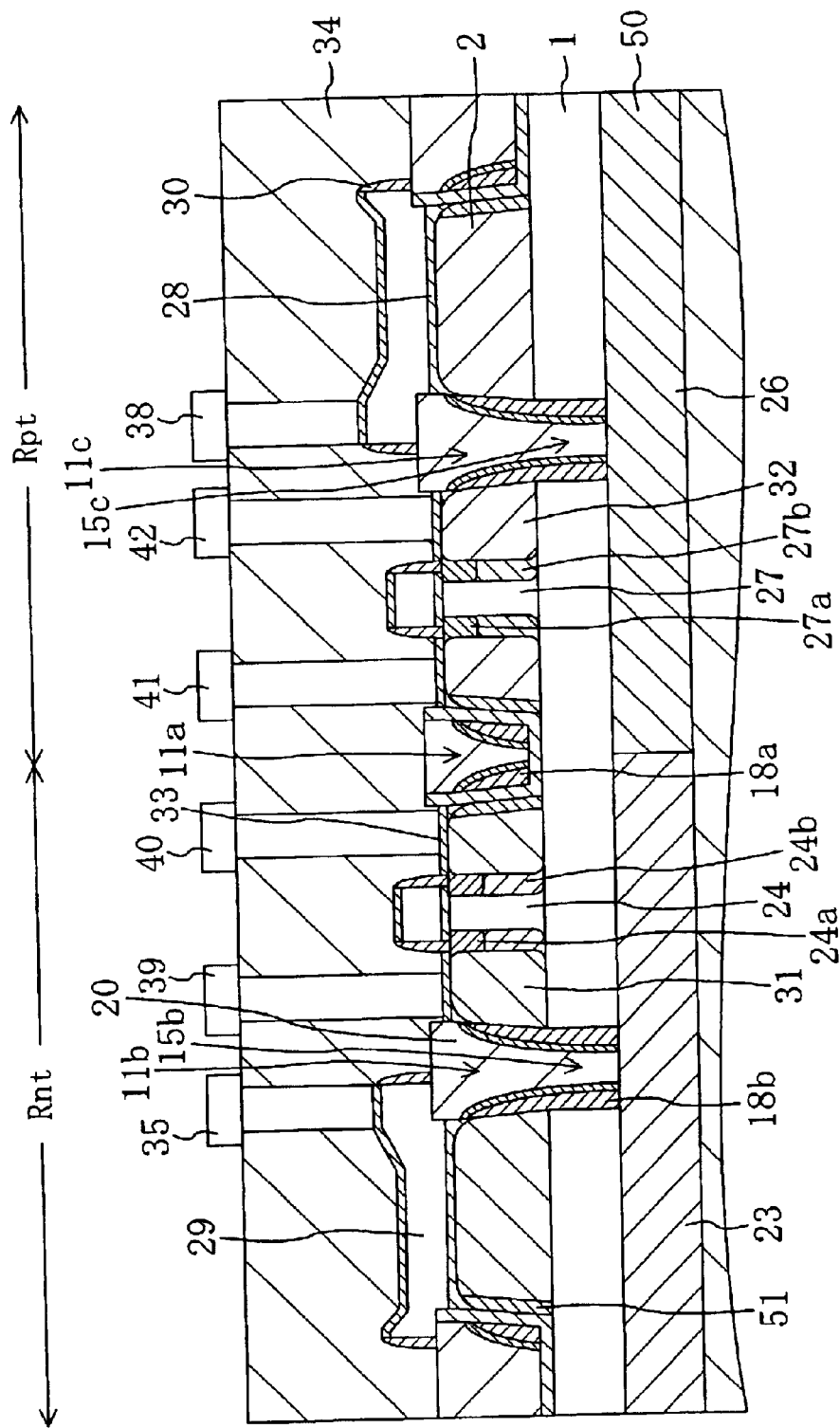
FIG. 13 is a cross-sectional view illustrating the step of forming the wiring in the process of fabricating the semiconductor device according to the embodiment.
Figure 14:
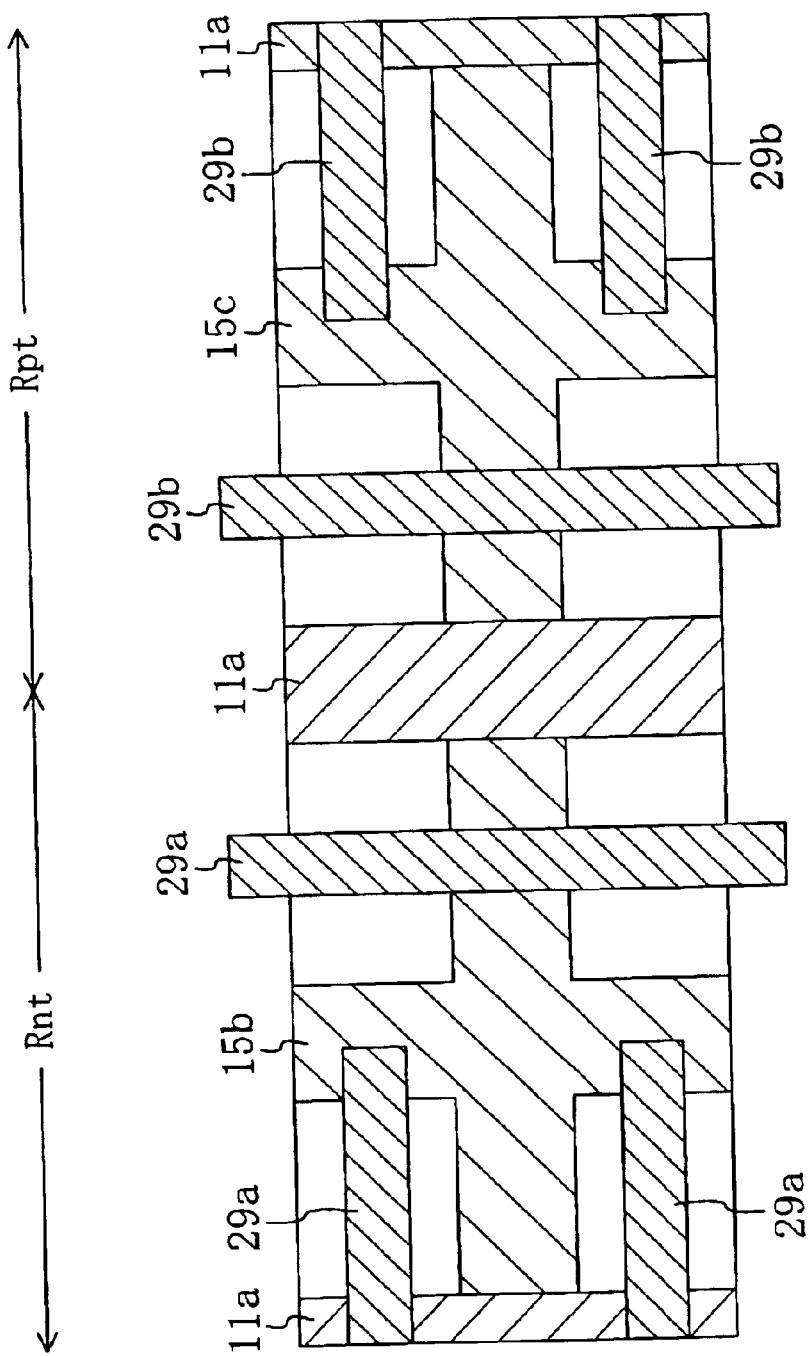
FIG. 14 is a cross-sectional view illustrating the step shown in FIG. 13 in the process of fabricating the semiconductor device according to the embodiment.
Figure 15A:
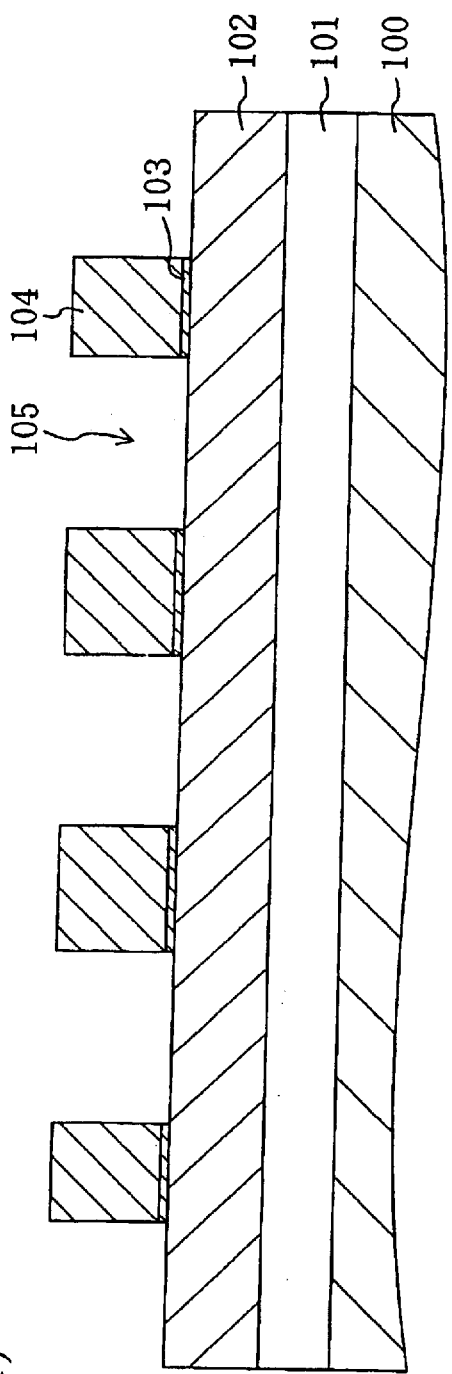
FIGS. 15A and 15B are cross-sectional views illustrating the process steps of fabricating a semiconductor device in accordance with a conventional fabrication method.
Figure 15B:
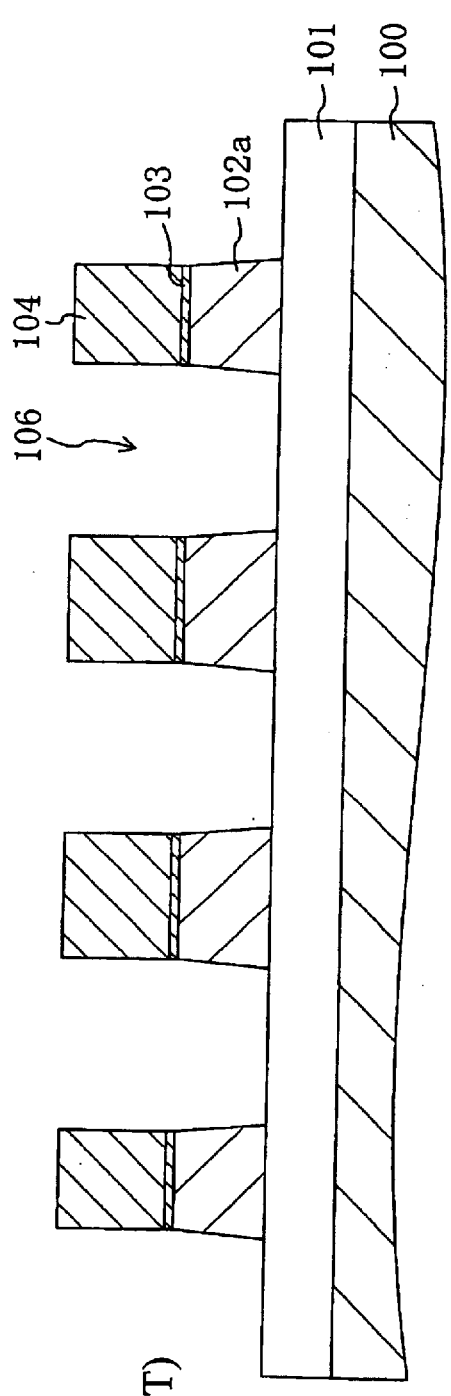
Figure 16A:
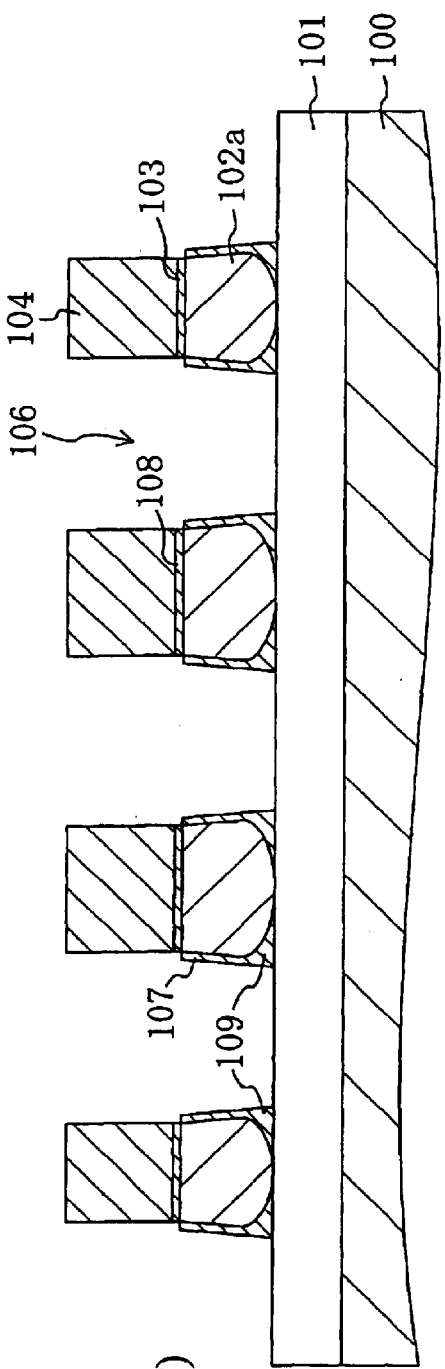
FIGS. 16A and 16B are cross-sectional views illustrating the process steps of fabricating a semiconductor device in accordance with the conventional fabrication method.
Figure 16B:
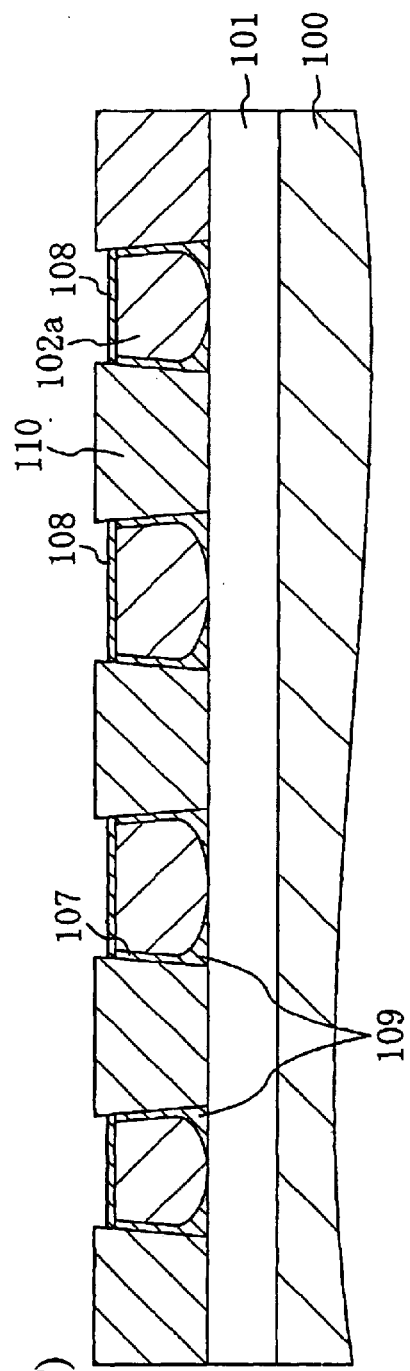

Thereafter, an NMISN lightly doped source/drain diffusion layer 24a, NMISP pocket layers 24b, a PMISP lightly doped source/drain diffusion layer 27a, and PMISN pocket layers 27b are formed by lithography and ion implantation, though they are not depicted in the cross-sectional view of FIG. 10B (see FIG. 13).

Thereafter, LDD sidewalls 30 are formed over the side surfaces of the gate electrodes 29. By using the gate electrodes 29 and the LDD sidewalls 30 as a mask, arsenic ions, e.g., are implanted in the NMIS isolation region Rnt at a dose of $3.0 \times 10^{15}$ atoms/cm$^2$ with an acceleration energy of 50 KeV so that an NMISN heavily doped source/drain diffusion layer 31 is formed, while boron ions, e.g., are implanted in the PMIS isolation region Rpt at a dose of $2.0 \times 10^{15}$ atoms/cm$^2$ with an acceleration energy of 5 KeV so that a PMISP heavily doped source/drain diffusion layer 32 is formed.

Further, a salicide layer 33 is formed over the gate electrodes 29 and the active regions.

Figure 11:
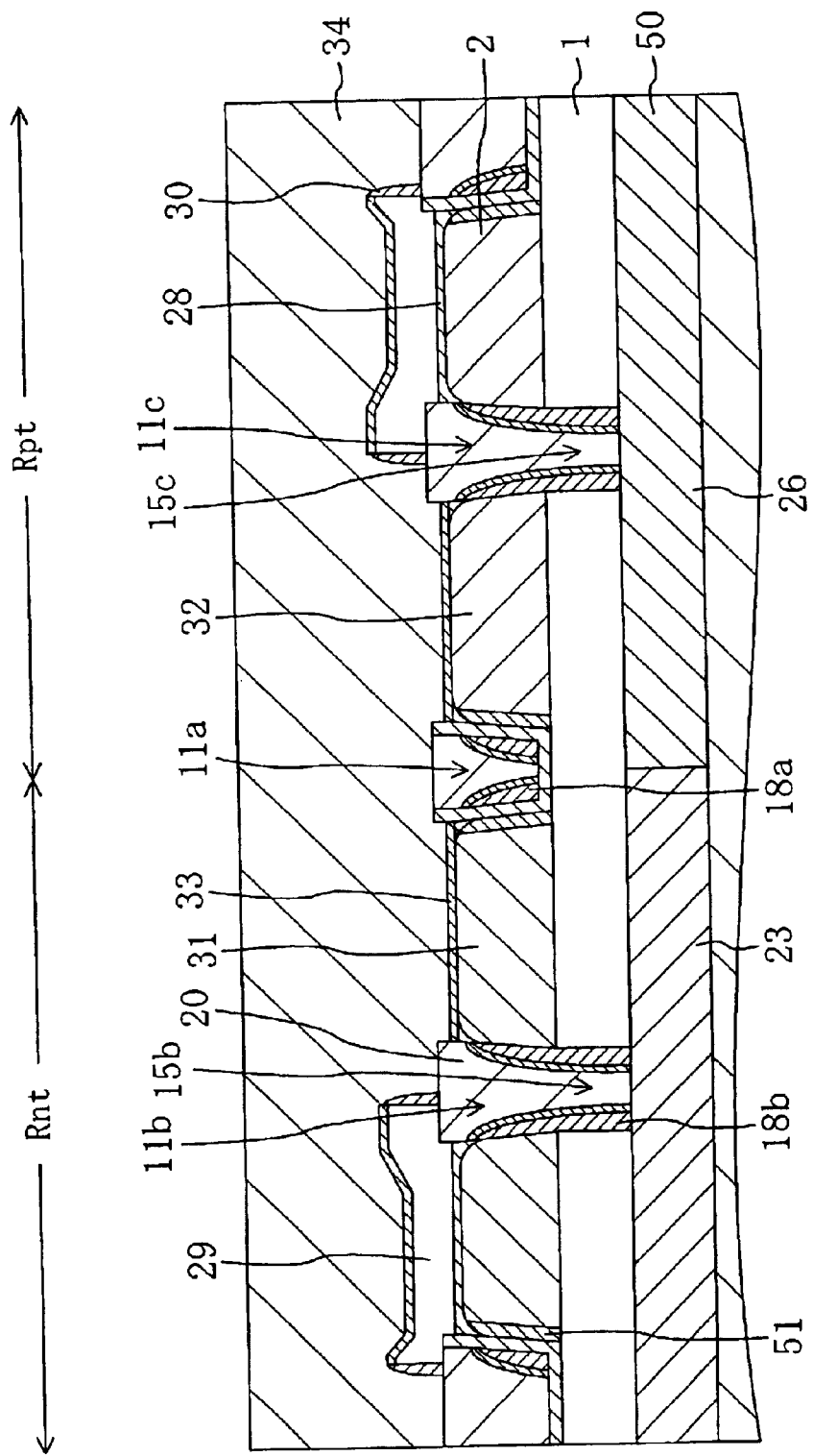
FIG. 11 is a cross-sectional view illustrating the step of forming an interlayer film in the process of fabricating the semiconductor device according to the embodiment.

Next, in the step shown in FIG. 11, an interlayer film 34 is formed on the substrate.

Figure 12:
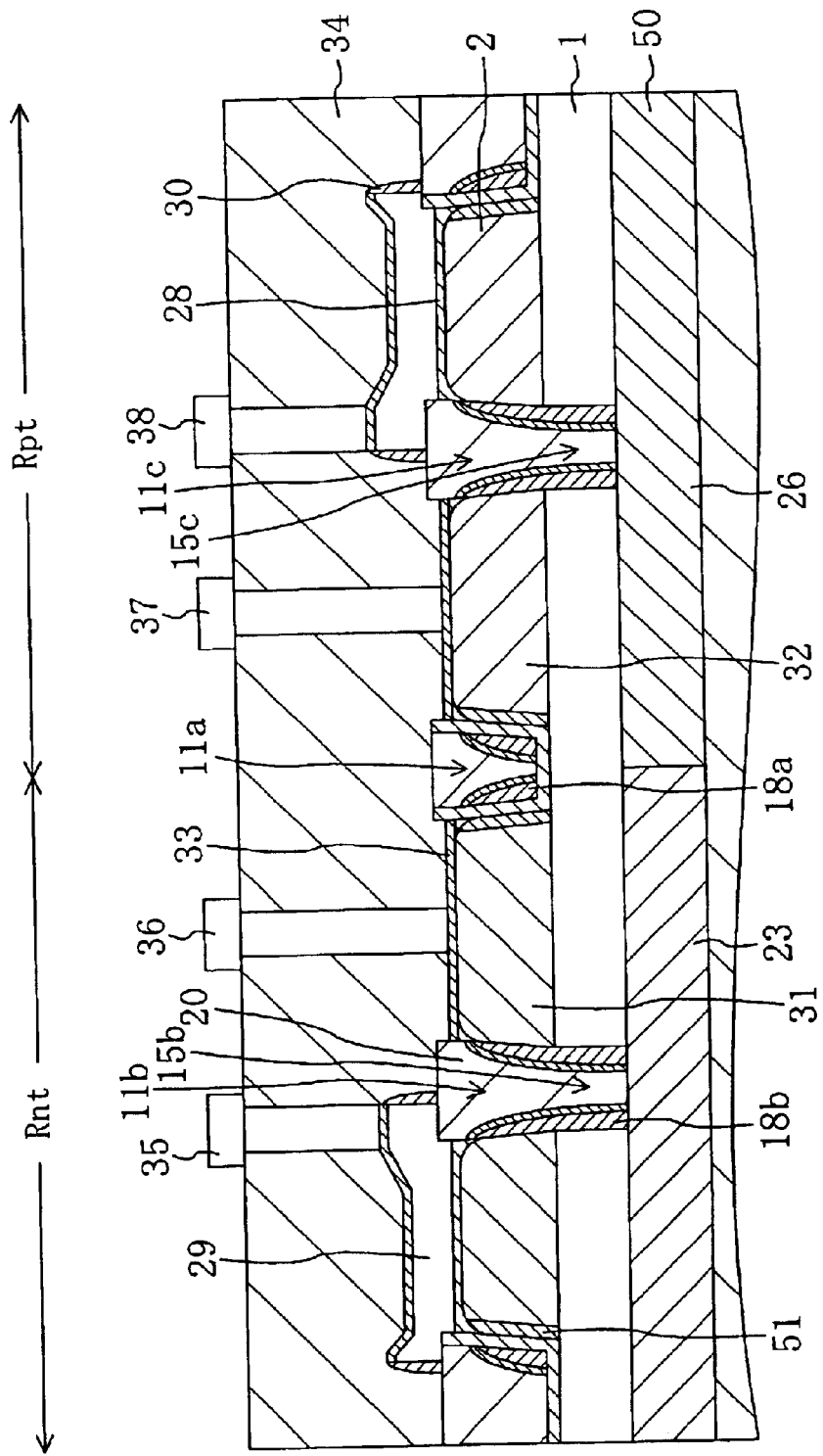
FIG. 12 is a cross-sectional view illustrating the step of forming wiring in the process of fabricating the semiconductor device according to the embodiment.

Next, in the step shown in FIG. 12, an NMIS gate electrode contact 35 extending through the interlayer film 34 to reach the gate electrode of an N-channel transistor, an NMIS substrate contact 36 reaching the active region of an N-channel transistor, a PMIS gate electrode contact 38 reaching the gate electrode of a P-channel transistor, and a PMIS substrate contact 37 reaching the active region of a P-channel transistor are formed.

By further forming an NMIS source electrode contact 39 extending through the interlayer film 34 to reach the source region of the NMISN heavily doped source/drain diffusion layer 31, an NMIS drain electrode contact 40 reaching the drain region of the NMISN heavily doped source/drain diffusion layer 31, a PMIS source electrode contact 41 reaching the source region of the PMISP heavily doped source/drain diffusion layer 32, and a PMIS drain electrode contact 42 reaching the drain region of the PMISP heavily doped source/drain diffusion layer 32, a structure as shown in FIG. 13 is obtained. FIG. 13 is a vertical cross-sectional view showing a structure of one of the transistors of the semiconductor device according to the present embodiment in a cross section parallel to the direction of the gate length, while showing a structure of another of the transistors in a cross section perpendicular to the direction of the gate length. Therefore, FIG. 13 also shows diffusion layers formed in the step shown in FIG. 10B but not shown in FIG. 10B. It is to be noted that the salicide layer 33 is formed between each of the contacts and each of the gate electrodes, the active regions, and the diffusion layers.

A description will be given herein below to the characteristics of the method for fabricating a SOI device according to the present embodiment.

First, the body potential can be fixed by forming the sidewalls over the side surfaces of the trenches to provide electrical connections between the transistor regions and the semiconductor substrate 50. Referring to FIGS. 13 and 14, a detailed description will be given herein below. FIG. 14 is a plan view showing the layout of the gate electrodes 29, the NMISBOX trench 15b, the PMISBOX trench 15c, and the NMIS-PMIS trenches 11a in the semiconductor device shown in FIG. 13. Of the gate electrodes 29, FIG. 14 shows the gate electrodes of the N-channel transistors as NMIS gate electrodes 29a and the gate electrodes of the P-channel transistors as PMIS gate electrodes 29b.

In accordance with the conventional method for fabricating a SOI device, it is difficult to fix the body potential since the transistor regions are completely isolated from the semiconductor substrate by the BOX film and the STI. To fix the body potential, a special pattern obtained by altering the layout should be formed.

In accordance with the fabrication method of the present embodiment, by contrast, the NMISBOX trench 15b is formed in the boundary between the regions of the NMIS formation region Rnt in which the N-channel transistors are to be formed, as shown in FIG. 14. As a result, the Si layer 2 of each of the N-channel transistors is connected to an external circuit by the third sidewall 18b, the NMIS contact diffusion layer 23, and the NMIS substrate contact 36 as shown in FIG. 13, so that the body potential of the N-channel transistor is fixed. On the other hand, the PMIS-BOX trench 15c is formed in the boundary between the regions of the PMIS formation region Rpt in which the P-channel transistors are to be formed. In the arrangement, the Si layer 2 of each of the P-channel transistors is also connected to the external circuit by the third sidewall 18b, the PMIS contact diffusion layer, and the PMIS substrate contact 37, so that the body potential of the P-channel transistor is fixed.

In accordance with the fabrication method of the present embodiment, each of the NMIS-PMIS trenches 11a is formed in the boundary between the region in which the N-channel transistors are to be formed and the region in which the P-channel transistors are to be formed, as shown in FIG. 14. Since the NMIS-PMIS trench 11a is not reaching the semiconductor substrate 50, as shown in FIG. 13, a connecting portion with the external circuit is not formed. If an RF signal is used, noise between the transistors which is likely to occur when the respective signal transmitters of the N-channel and P-channel transistors are in close proximity can be suppressed.

Second, the upper-surface edge portions of the Si layer 2 in which the source/drain regions are formed can be rounded off more positively by oxidation, while the lower-surface edge portions of the Si layer 2 can be prevented from being deformed by oxidation.

When the sidewall oxide films are formed by oxidizing the side surfaces of the Si layer in which the source/drain regions are formed in accordance with the conventional fabrication method, the upper-surface edge portions of the Si layer are also oxidized simultaneously to be rounded off. To round off the upper-edge portions of the Si layer, oxidation should be performed to form oxide films each having a given thickness or more. As a consequence, oxidation of the lower-surface edge portions of the Si layer is more likely to proceed and the Si layer may warp to be deformed.

On the other hand, the present embodiment has formed the sidewall oxidation films 51 in the step shown in FIG. 4A and rounded off the upper-surface edge portions of the Si layer 2 in the step shown in FIG. 6B. This obviates the necessity to form oxide films each having an excessively large thickness in the step shown in FIG. 4A so that the lower-surface edge portions of the Si layer 2 are more resistant to oxidation. In contrast to the upper-surface edge portions of the Si layer 2 which are in a state prone to oxidation in the step shown in FIG. 6B, the lower-surface edge portions of the Si layer 2 which are covered with the second and third sidewalls 18a and 18b are in a state resistant to oxidation. Even if oxidation is performed to form oxide films each having a given thickness or more such that the upper-surface edge portions of the Si layer 2 are rounded off, the lower-surface edge portions of the Si layer 2 are kept from significant oxidation. This suppresses the occurrence of a leakage current resulting from a failure caused by significant deformation.

Other Embodiments

A first object of the foregoing embodiment is to provide a connection between the Si layer 2 as a semiconductor layer and the external circuit. A second object of the foregoing embodiment is to oxidize the upper-surface edge portions of the Si layer 2 without oxidizing the lower-surface edge portions of the Si layer 2. Although each of the first and second objects has been attained in the foregoing embodiment, the present invention can also embrace the case where either one of the first and second objects is attained since the two objects are independent of each other.

If only the first object is to be attained, e.g., it is unnecessary to form the L-shaped sidewalls 10 and the dummy sidewalls 9 in the steps shown in FIGS. 2A to 3A. This is because, if the L-shaped sidewalls 10 are not formed, the first sidewall 17 cannot be separated from the second and third sidewalls 18a and 18b in the step shown in FIG. 6A and the upper-surface edge portions of the Si layer 2 cannot be exposed but no problem is encountered if the upper-surface edge portions of the Si layer 2 are not oxidized.

The foregoing embodiment has formed the NMIS-PMIS trenches 11a each formed in the region located between the region to be formed with the N-channel transistors and the region to be formed with the P-channel transistors such that the upper surface of the BOX layer 1 forms the bottom surface of the NMIS-PMIS trench 11a. In accordance with the present invention, however, it is sufficient for the NMIS-PMIS trench 11a not to extend through the BOX layer 1 and reach the semiconductor substrate 50. In other words, the NMIS-PMIS trench 11a may also be formed by partly removing the BOX layer 1 to leave a portion thereof having a given thickness.

In addition to the case where the NMIS-PMIS trench 11a is formed by halfway removing the BOX layer 1, the present invention may also form, under each of the NMIS-PMIS trenches 11a, a BOX trench extending through the BOX layer 1 and reaching the semiconductor substrate 50. A description will be given herein below to a structure obtained in that case.

Although the trench extending through the BOX layer 1 has not been formed under the NMIS-PMIS trench 11a formed in the region located between the region to be formed with the N-channel transistors and the region to be formed with the P-channel transistors in the foregoing embodiment, a BOX trench extending through the BOX layer 1 and reaching the semiconductor substrate 50 may also be formed under the NMIS-PMIS trench 11a. In that case, the formation of a TEOS film over the respective inner walls of the NMIS-PMIS trench 11a and the BOX trench formed thereunder circumvents the situation in which the region to be formed with the N-channel transistors and the region to be formed with the P-channel transistors are connected in close proximity to the substrate, so that the occurrence of noise is suppressed. If the BOX trench is formed under the NMIS-PMIS trench 11a, it can be formed in the same steps of forming the NMISBOX trench 15b and the PMISBOX trench 15c in other regions. This offers the advantage of saving the step of forming the mask in and over the NMIS-PMIS trench 11a (FIG. 4B).

Although the semiconductor elements formed in the Si layer 2 have been field-effect transistors in the foregoing embodiment, the present invention can also use other semiconductor elements such as capacitor elements, resistor elements, and diodes.

Although the foregoing embodiment has filled each of the trenches 11a to 11c and the BOX trenches 15b and 15c with the plasma CVD oxide film 20, the present invention can also use a structure in which the plasma CVD oxide film 20 is removed and each of the trenches is hollow.

What is claimed is:

1. A semiconductor device comprising:

a semiconductor substrate;

an insulator layer provided on the semiconductor substrate;

a semiconductor layer which is provided on the insulator layer and formed with a semiconductor element;

a first trench passing through the semiconductor layer and the insulator layer and reaching the semiconductor substrate;

a first sidewall composed of a conductor material, and formed within the first trench such that the sidewall is directly in contact with the side surfaces of the semiconductor layer; and a first oxide film burying the first trench in which the first sidewall is formed, wherein the semiconductor layer and the semiconductor substrate are electrically connected by the first sidewall.

2. The semiconductor device of claim 1, wherein the semiconductor layer has a region to be formed with a first-conductivity-type transistor and a region to be formed with a second-conductivity-type transistor and a second trench located between the region to be formed with the first-conductivity-type transistor and the region to be formed with a second-conductivity-type transistor is not reaching the semiconducter substrate.

3. The semiconductor device of claim 1, wherein a top portion of the first sidewall is at a level lower than the upper surface of the semiconductor layer.

4. The semiconductor device of claim 2, wherein at least one portion of the insulator layer having a specified thickness is interposed between the semiconductor substrate and a bottom surface of the second trench.

5. The semiconductor device of claim 2, wherein a bottom surface of the second trench is at a level higher than a lower surface of the insulator layer.

6. The semiconductor device of claim 2, wherein a top portion of the first sidewall is at a level lower than the upper surface of the semiconductor layer.

7. The semiconductor device of claim 1, wherein the conductor material is amorphous.

8. The semiconductor device of claim 1, wherein the conductor material is a polycrystalline semiconductor material.

9. The semiconductor device of claim 2 further comprises, a sidewall oxide film formed on side surfaces of the semiconductor layer in the second trench, a TEOS film covering surfaces within the second trench in which the sidewall oxide film is formed, and a second sidewall composed of a conductor material, and formed on the TEOS film on the side surfaces of the semiconductor layer in the second trench.

10. The semiconductor device of claim 9, wherein the second sidewall includes a second oxide film buried in the second trench.

* * * * *